United States Patent
Liu et al.

(10) Patent No.: US 8,384,204 B2
(45) Date of Patent: Feb. 26, 2013

(54) CIRCUIT CARRIER AND SEMICONDUCTOR PACKAGE USING THE SAME

(75) Inventors: Chien Liu, Kaohsiung (TW); Chih-Ming Chung, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 434 days.

(21) Appl. No.: 12/683,613

(22) Filed: Jan. 7, 2010

(65) Prior Publication Data
US 2010/0213598 A1 Aug. 26, 2010

(30) Foreign Application Priority Data
Feb. 23, 2009 (TW) ................... 98105657 A

(51) Int. Cl.
*H01L 23/482* (2006.01)
*H05K 1/09* (2006.01)
(52) U.S. Cl. .................................. 257/690
(58) Field of Classification Search ............ 257/41, 257/81, 82, 91, 99, 177–182, 276, 457, 459, 257/502, 503, 573, 584, 602, 621, 664–677, 257/688–700, 734–786
See application file for complete search history.

(56) References Cited

U.S. PATENT DOCUMENTS

| | | | |
|---|---|---|---|
| 6,510,976 B2 * | 1/2003 | Hwee et al. | 228/180.22 |
| 7,170,172 B2 * | 1/2007 | Tomimori et al. | 257/739 |
| 2002/0170942 A1 * | 11/2002 | Hwee et al. | 228/180.22 |
| 2008/0286958 A1 * | 11/2008 | Chang et al. | 438/612 |
| 2009/0081830 A1 * | 3/2009 | Omandam et al. | 438/118 |

FOREIGN PATENT DOCUMENTS

| TW | 466724 | 12/2001 |
|---|---|---|
| TW | I236746 | 7/2005 |
| TW | 200820401 | 5/2008 |

OTHER PUBLICATIONS

"First Office Action of China Counterpart Application", issued on Aug. 22, 2011, p1-p3.
"Office Action of Taiwan Counterpart Application", issued on May 15, 2012, p1-p5.

* cited by examiner

*Primary Examiner* — Dao H Nguyen
*Assistant Examiner* — Tram H Nguyen
(74) *Attorney, Agent, or Firm* — J.C. Patents

(57) ABSTRACT

A circuit carrier suitable for being connected with a bump is provided. The circuit carrier includes a substrate and at least one bonding pad. The substrate has a bonding pad disposed on a surface thereof for being connected with the bump. A brown-oxide layer is disposed on a surface of the bonding pad.

15 Claims, 4 Drawing Sheets

CIRCUIT CARRIER AND SEMICONDUCTOR PACKAGE USING THE SAME

CROSS-REFERENCE TO RELATED APPLICATION

This application claims the priority benefit of Taiwan application serial No. 98105657, filed Feb. 23, 2009. All disclosure of the Taiwan application is incorporated herein by reference.

BACKGROUND OF THE INVENTION

1. Field of the Invention

The present invention relates to a circuit carrier and a semiconductor package using the same, more particularly, to a circuit carrier forming a brown-oxide layer on a bonding pad of a substrate and a semiconductor package using the same.

2. Description of Related Art

The flip chip interconnect technology for connecting a die to a carrier can be summarized as follows. A plurality of pads is arranged on an active surface of the die in area arrays, and bumps (i.e. solder bumps) are formed on the pads with the under bump metallurgy (UBM) therebetween. Then, the die is flipped. The pads on the active surface of the chip electrically and structurally connect to a plurality of contacts on the surface of a carrier (i.e. a substrate or a printed circuit board) via the bumps. It should be noted that the flip chip interconnect technology is suitable for high pin count chip packages and has the advantages of minimizing the package region and shortening the signal transmission path.

FIG. 1A is a schematic cross-sectional view illustrating a conventional circuit carrier before bonding to a bump on a corresponding die. FIG. 1B is a schematic cross-sectional view illustrating the conventional circuit carrier, which is shown in FIG. 1A, after bonding to the bump on the corresponding die. Referring to FIG. 1A, a circuit carrier 100 mainly includes a substrate 110, a plurality of bonding pads 120a, and a solder mask 130. The substrate 110 includes a plurality of conductive layers, a plurality of insulating layers, and a plurality of conductive vias (none shown in the figures). Each insulating layer is disposed between two adjacent conductive layers, and each conductive via passes through at least one insulating layer to be connected with at least two conductive layers. Moreover, the bonding pads 120a are disposed on a surface 112 of the substrate 110 for connecting a plurality of bumps 210 on a corresponding die 200 respectively. Here, the bumps 210 are flip chip solder bumps, for example. The bonding pads 120a can be constituted by a conductive circuit layer 120 on the outermost layer of the substrate 110. As the material of the conductive circuit layer 120 on the substrate 110 is usually copper, the material of the bonding pads 120a is also copper. A solder mask 130 covers on the surface 112 of the substrate 110 entirely, and the solder mask 130 has a plurality of openings 132 for exposing the bonding pads 120a individually.

As shown in FIG. 1B, when a reflow process is performed to connect the bumps 210 and the bonding pads 120a, the bumps 210 and the bonding pads 120a are well bonded. Consequently, the bumps 210 topple to enclose the bonding pads 120a entirely. Hence, the pitch between the circuit carrier 100 and the corresponding die 200 is reduced, thereby increasing the difficulty of the following process.

In addition, the openings 132 have the process tolerance during the manufacture of the solder mask 130, such that the shift may occur to the solder mask 130. As for the fine pitch elements, the aforesaid factors all elevate the difficulty in the manufacture of circuit carriers.

SUMMARY OF THE INVENTION

A circuit carrier and a semiconductor package using the same are provided in the present invention. The circuit carrier mainly forms a brown-oxide layer on bonding pads thereof to solve the problems of reduced pitch between the circuit carrier and a die due to bump toppling, and the shift that occurs in the manufacture of a solder mask in the conventional techniques.

A circuit carrier suitable for being connected with a bump is provided in the present invention. The circuit carrier includes a substrate and at least one bonding pad. The substrate has a surface. The bonding pad is disposed on the surface of the substrate to connect the bump. Here, a surface of the bonding pad has a brown-oxide layer.

In one embodiment of the present invention, a material of the bonding pad comprises metal.

In one embodiment of the present invention, the material of the bonding pad includes copper.

In one embodiment of the present invention, a material of the brown-oxide layer comprises metal oxide.

In one embodiment of the present invention, the material of the brown-oxide layer includes copper oxide.

A semiconductor package including a die, a circuit carrier, and a molding compound is further provided in the present invention. At least one bump is disposed on an active surface of the die. The circuit carrier is used to carry the die, and includes a substrate and at least one bonding pad disposed on the substrate surface. A brown-oxide layer is disposed on a surface of the bonding pad. The bonding pad connects the corresponding bump, so that the circuit carrier is electrically connected to the die via the bump. The molding compound is disposed on the circuit carrier to enclose the die.

In one embodiment of the present invention, a material of the bonding pad comprises metal.

In one embodiment of the present invention, the material of the bonding pad includes copper.

In one embodiment of the present invention, a material of the brown-oxide layer comprises metal oxide.

In one embodiment of the present invention, the material of the brown-oxide layer includes copper oxide.

In one embodiment of the present invention, the semiconductor package further includes an underfill, which is filled between the die and the circuit carrier.

In one embodiment of the present invention, the bump exposes a portion of the corresponding bonding pad.

In one embodiment of the present invention, the bump only contacts the brown-oxide layer and the active surface of the die and dose not contact the substrate.

In one embodiment of the present invention, a portion of the molding compound is filled between the die and the circuit carrier.

In one embodiment of the present invention, the circuit carrier is a printed circuit board.

The circuit carrier and the semiconductor package using the same in the present invention mainly form a brown-oxide layer on the surface circuit of the substrate and the bonding pad. When the circuit carrier is bonded with the corresponding die, the bump can be directly disposed on the brown-oxide layer of the bonding pad surface for increasing the pitch between the circuit carrier and the corresponding die, so that the following process can be performed easily.

In addition, after the brown-oxide layer has been formed on the surface circuit of the circuit carrier and the bonding pad, the circuit carrier can be connected to the corresponding die directly without forming the solder mask. Hence, the problems of process tolerance and shifting from applying the solder mask in the conventional techniques can be prevented.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
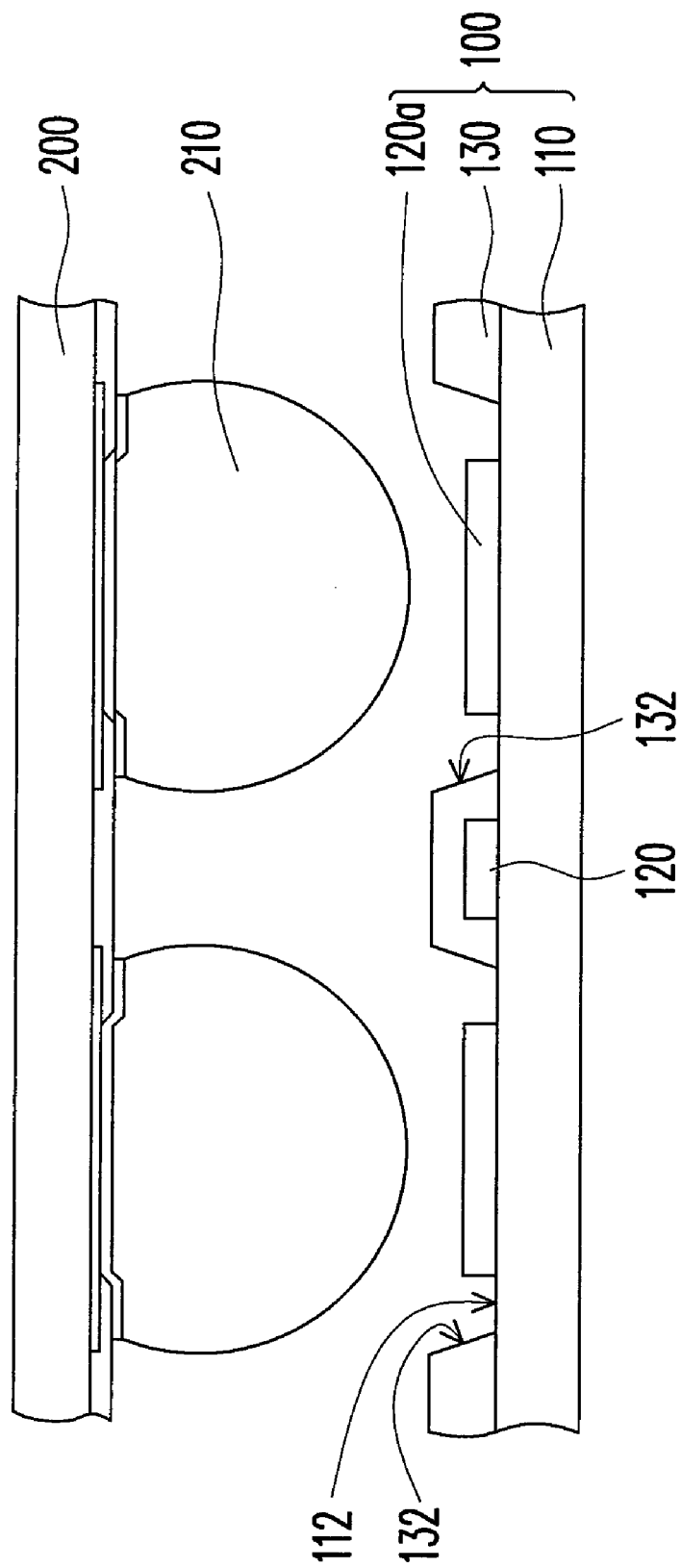
FIG. 1A is a schematic cross-sectional view illustrating a conventional circuit carrier before bonding to a bump on a corresponding die.
Figure 1B:
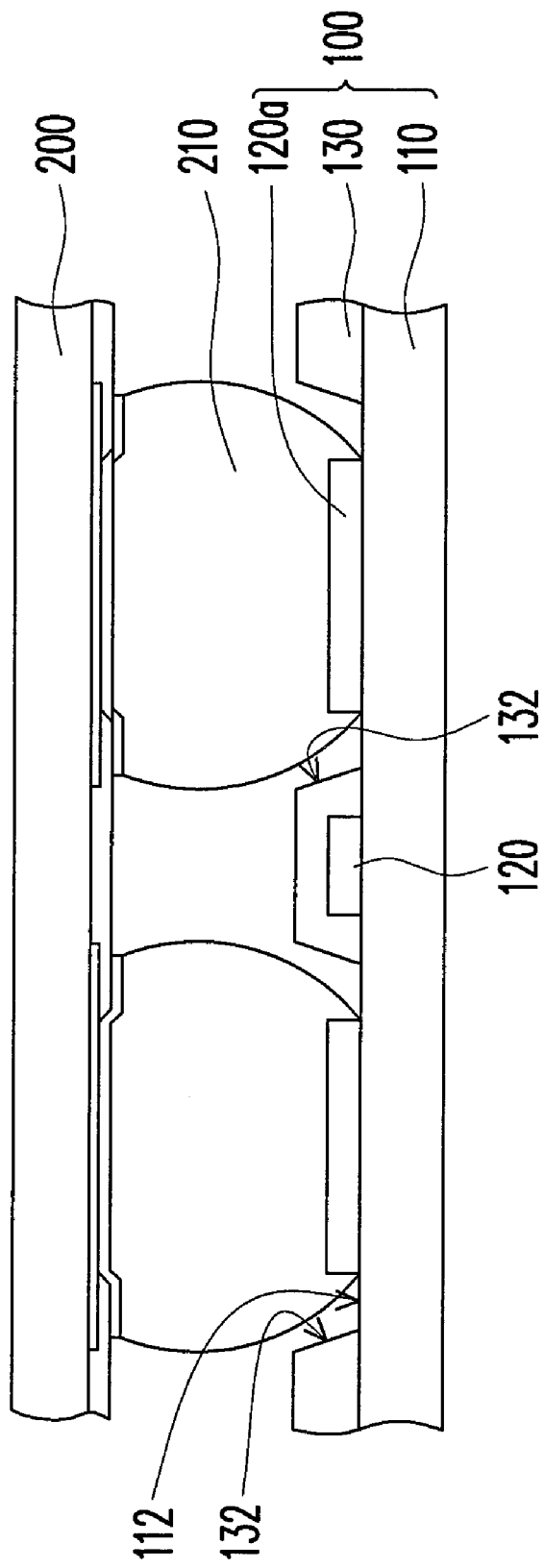
FIG. 1B is a schematic cross-sectional view illustrating the conventional circuit carrier, which is shown in FIG. 1A, after bonding to the bump on the corresponding die.
Figure 2:
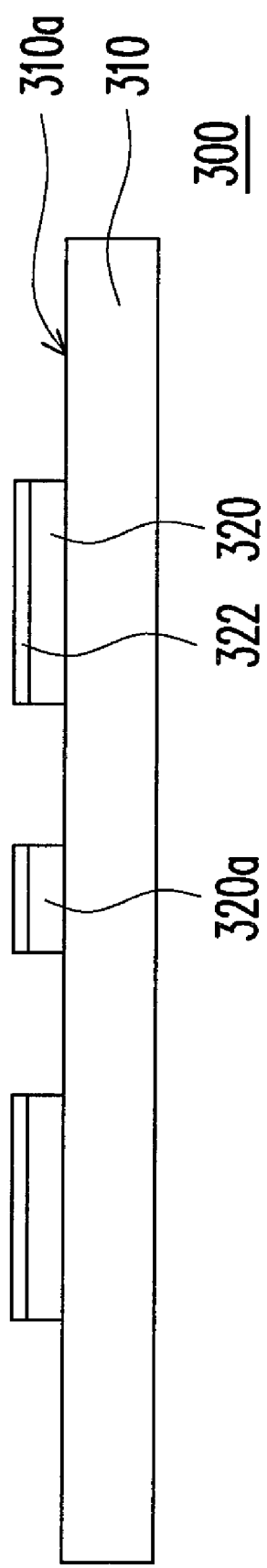
FIG. 2 is a schematic cross-sectional view illustrating a circuit carrier according to an embodiment of the present invention.

FIG. 2 is a schematic cross-sectional view illustrating a circuit carrier according to an embodiment of the present invention. Referring to FIG. 2, a circuit carrier 300 includes a substrate 310 and at least one bonding pad 320. In the following, the elements in the circuit carrier 300 and the connection relationship therebetween are illustrated with accompanied figures. In the present embodiment, a plurality of bonding pads 320 is taken as an example for illustration; however, the present invention does not limit the number of bonding pads 320 being disposed on the substrate 310.

The substrate 310 includes a plurality of conductive layers, a plurality of insulating layers, and a plurality of conductive vias (none shown in the figure). Each insulating layer is disposed between two adjacent conductive layers, and each conductive via passes through the insulating layer to be connected with at least two conductive layers. The bonding pads 320 are disposed on a surface 310a of the substrate 310 to connect the bumps, which are disposed on the corresponding die (not shown) for flip chip interconnection. The bonding pads 320 can be constituted by a surface circuit layer on the outermost layer of the substrate 310. As the material of the surface circuit layer of the substrate 310 is usually metal (copper, for example), the material of the bonding pads 320 is also metal (copper, for example). Additionally, a brown-oxide layer 232 is formed on the surfaces of the bonding pads 320. The brown-oxide layer 322 can be formed by performing a brown-oxidation process to a surface circuit layer 320a on the substrate 310 and the bonding pads 320. In the present embodiment, the material of the brown-oxide layer 322 is metal oxide (copper oxide, for example).

When the bonding pads 320 of the circuit carrier 300 are bonded to the bumps on the corresponding die with the reflow process, the bumps are disposed on the brown-oxide layer 322 on the surfaces of the bonding pads 320. Therefore, the bumps do not topple to enclose the bonding pads 320 entirely. In other words, the bumps expose a portion of each of the bonding pads 320. Consequently, the pitch between the circuit carrier 300 and the corresponding die is increased so that the following underfill process can be performed more easily.

Figure 3:
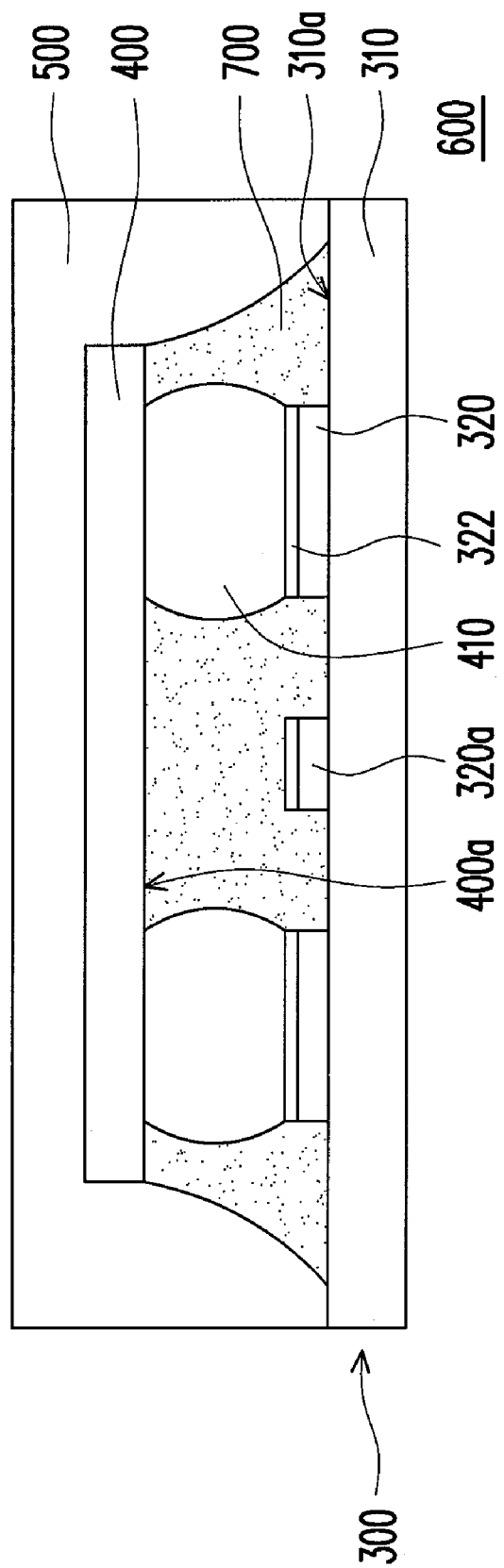
FIG. 3 is a schematic cross-sectional view of a semiconductor package according to an embodiment of the present invention.

FIG. 3 is a schematic cross-sectional view of a semiconductor package according to an embodiment of the present invention. This semiconductor package mainly connects the circuit carrier shown in FIG. 2 with the corresponding die to prevent the bumps and the bonding pads from bonding too well so as to result in bump toppling as in the conventional techniques.

Referring to FIG. 3, a semiconductor package 600 mainly includes a circuit carrier 300 (printed circuit board, for example) as shown in FIG. 2, a die 400, and a molding compound 500. A plurality of bumps 410 is disposed on an active surface 400a of the die 400. The circuit carrier 300 carries the die 400, and includes a substrate 310 and bonding pads 320 that are disposed on the surface of the substrate 310. Similarly, a brown-oxide layer 232 is formed on the surfaces of the bonding pads 320. The bonding pads 320 are connected to the corresponding bumps 410, so that the circuit carrier 300 is electrically connected to the die 400 via the bumps 410. As shown in FIG. 3, a brown-oxide layer 322 is formed on the bonding pads 320. Therefore, the bumps 410 are disposed on the brown-oxide layer 322 on the surfaces of the bonding pads 320. The bumps 410 only contact the brown-oxide layer 322 and the active surface 400a of the die 400 and do not contact the substrate 310. As a consequence, the bumps do not topple, so the pitch between the circuit carrier 300 and the die 400 is increased for the following underfill process to be performed more easily.

The molding compound 500 is disposed on the circuit carrier 300. The molding compound 500 encloses the die 400 entirely to protect the molding structure from being damaged and moistened. In this embodiment, an underfill 700 is filled between the circuit carrier 300 and the die 400. Thereafter, the molding compound 500 is formed on the circuit carrier 300 for enclosing the die 400 entirely. However, the molding compound 500 can be formed on the circuit carrier 300 directly, so that the molding compound 500 is also filled between the circuit carrier 300 and the die 400.

In summary, the circuit carrier and the semiconductor package using the same in the present invention mainly form a brown-oxide layer on the surface circuit of the substrate and the bonding pads. When the circuit carrier is bonded with the corresponding die, the bump can be directly disposed on the brown-oxide layer of the bonding pad surfaces for increasing the pitch between the circuit carrier and the corresponding die, so that the following process can be performed easily. In addition, after the brown-oxide layer has been formed on the surface circuit of the circuit carrier and the bonding pad, the circuit carrier can be connected to the corresponding die directly without forming the solder mask. Hence, the problems of process tolerance and shift from applying the solder mask in the conventional techniques can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit carrier suitable for being connected with a bump, the circuit carrier comprising:
   a substrate, having a surface; and
   at least one bonding pad, disposed on the surface of the substrate for being connected with the bump without being covered by a solder mask, wherein a surface of the bonding pad comprises a brown-oxide layer.

2. The circuit carrier as claimed in claim 1, wherein a material of the bonding pad comprises metal.

3. The circuit carrier as claimed in claim 2, wherein a material of the bonding pad comprises copper.

4. The circuit carrier as claimed in claim 1, wherein a material of the brown-oxide layer comprises metal oxide.

5. The circuit carrier as claimed in claim 4, wherein a material of the brown-oxide layer comprises copper oxide.

6. A semiconductor package, comprising:
a die, having at least one bump on an active surface of the die;
a circuit carrier for carrying the die, the circuit carrier comprising:
a substrate, having a surface; and
at least one bonding pad, disposed on the surface of the substrate without being covered by a solder mask, wherein a brown-oxide layer is disposed on a surface of the bonding pad, and the bonding pad is connected with the corresponding bump, so that the circuit carrier is electrically connected to the die via the bump; and
a molding compound, disposed on the circuit carrier to enclose the die.

7. The semiconductor package as claimed in claim 6, wherein a material of the bonding pad comprises metal.

8. The semiconductor package as claimed in claim 7, wherein a material of the bonding pad comprises copper.

9. The semiconductor package as claimed in claim 6, wherein a material of the brown-oxide layer comprises metal oxide.

10. The semiconductor package as claimed in claim 9, wherein a material of the brown-oxide layer comprises copper oxide.

11. The semiconductor package as claimed in claim 6, further comprising an underfill filled between the die and the circuit carrier.

12. The semiconductor package as claimed in claim 6, wherein the bump exposes a portion of the corresponding bonding pad.

13. The semiconductor package as claimed in claim 6, wherein the bump only contacts the brown-oxide layer and the active surface of the die and dose not contact the substrate.

14. The semiconductor package as claimed in claim 6, wherein a portion of the molding compound is filled between the die and the circuit carrier.

15. The semiconductor package as claimed in claim 6, wherein the circuit carrier is a printed circuit board.

* * * * *